United States Patent
Lee et al.

(10) Patent No.: US 9,129,746 B2
(45) Date of Patent: Sep. 8, 2015

(54) MULTILAYER CERAMIC ELECTRONIC COMPONENT AND BOARD FOR MOUNTING THE SAME

(71) Applicant: SAMSUNG ELECTRO-MECHANICS CO., LTD., Suwon, Gyunggi-do (KR)

(72) Inventors: Ki Yong Lee, Gyunggi-do (KR); Dae Bok Oh, Gyunggi-do (KR); Sung Hyung Kang, Gyunggi-do (KR); Jae Hun Choe, Gyunggi-do (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 219 days.

(21) Appl. No.: 13/966,260

(22) Filed: Aug. 13, 2013

(65) Prior Publication Data

US 2014/0355175 A1    Dec. 4, 2014

(30) Foreign Application Priority Data

May 31, 2013    (KR) .................. 10-2013-0062511

(51) Int. Cl.
*H01G 4/228* (2006.01)
*H01G 4/012* (2006.01)
*H01G 4/30* (2006.01)
*H01G 4/232* (2006.01)
*H01G 4/12* (2006.01)
*H05K 3/34* (2006.01)

(52) U.S. Cl.
CPC ............. *H01G 4/012* (2013.01); *H01G 4/232* (2013.01); *H01G 4/30* (2013.01); *H01G 4/12* (2013.01); *H05K 3/3442* (2013.01); *H05K 2201/10015* (2013.01); *H05K 2201/10636* (2013.01)

(58) Field of Classification Search
USPC ........ 361/306.3, 301.2, 301.4, 303–305, 309, 361/311–313, 321.1, 321.2
See application file for complete search history.

(56) References Cited

U.S. PATENT DOCUMENTS

| | | | | |
|---|---|---|---|---|
| 6,104,599 | A * | 8/2000 | Ahiko et al. ............... | 361/306.3 |
| 7,075,775 | B2 * | 7/2006 | Yamazaki .................. | 361/306.3 |
| 8,837,112 | B2 * | 9/2014 | Gu et al. .................... | 361/321.2 |
| 8,934,215 | B2 * | 1/2015 | Cho et al. ................... | 361/321.2 |
| 9,001,491 | B2 * | 4/2015 | Lee et al. ................... | 361/301.4 |
| 9,030,801 | B2 * | 5/2015 | Kim .......................... | 361/321.2 |
| 9,030,802 | B2 * | 5/2015 | Lee et al. ................... | 361/321.2 |
| 2005/0088803 | A1 | 4/2005 | Umeda et al. | |

FOREIGN PATENT DOCUMENTS

JP        2005-129802 A        5/2005

* cited by examiner

*Primary Examiner* — Nguyen T Ha
(74) *Attorney, Agent, or Firm* — McDermott Will & Emery LLP

(57) ABSTRACT

A multilayer ceramic electronic component includes a hexahedral ceramic body including dielectric layers and having first and second main surfaces opposing each other in a thickness direction, first and second end surfaces opposing each other in a length direction, and first and second side surfaces opposing each other in a width direction; first and second internal electrodes stacked to have the dielectric layer interposed therebetween within the ceramic body and alternately exposed through the first and second end surfaces; and first and second external electrodes electrically connected to the first and second internal electrodes, respectively, and including first and second head parts formed on the first and second end surfaces, wherein width of the first and second head parts is less than width of the ceramic body, and when length, width and thickness of the ceramic body are defined as L, W, and T, respectively, $T/W > 1.0$ is satisfied.

20 Claims, 6 Drawing Sheets

A – A'

B - B'

MULTILAYER CERAMIC ELECTRONIC COMPONENT AND BOARD FOR MOUNTING THE SAME

CROSS-REFERENCE TO RELATED APPLICATIONS

This application claims the priority of Korean Patent Application No. 10-2013-0062511 filed on May 31, 2013, in the Korean Intellectual Property Office, the disclosure of which is incorporated herein by reference.

BACKGROUND OF THE INVENTION

1. Field of the Invention

The present invention relates to a multilayer ceramic electronic component and a board for mounting the same.

2. Description of the Related Art

In accordance with the recent trend toward miniaturization of electronic products, the demand for a multilayer ceramic electronic component having a small size and large capacitance has increased.

Therefore, efforts to stack thin dielectric layers and internal electrodes in greater amounts have been attempted using various methods, and recently, a multilayer ceramic electronic component in which the thickness of dielectric layers is reduced and the number of dielectric layers stacked therein is increased has been manufactured.

The multilayer ceramic electronic component is able to be miniaturized, due to the dielectric layers and the internal electrodes being thinned, allowing the number of stacked layers to be increased for the implementation of high capacitance.

As described above, the multilayer ceramic electronic component is able to be miniaturized and have an increased number of stacked layers, thereby implementing high capacitance. However, a thickness of the resultant multilayer ceramic electronic component may be greater than a width thereof, and when the multilayer ceramic electronic component is mounted on a board, it may frequently topple over, whereby a failure rate in mounting the multilayer ceramic electronic component has increased.

Therefore, research into improvements in reliability by preventing multilayer ceramic electronic components from toppling over when being mounted on a board and preventing a short defect, while implementing high capacitance, remains required.

RELATED ART DOCUMENT (Patent Document 1) Japanese Patent Laid-Open Publication No. JP 2005-129802

SUMMARY OF THE INVENTION

An aspect of the present invention provides a multilayer ceramic electronic component and a board for mounting the same.

According to an aspect of the present invention, there is provided a multilayer ceramic electronic component including: a hexahedral ceramic body including dielectric layers and having first and second main surfaces opposing each other in a thickness direction, first and second end surfaces opposing each other in a length direction, and first and second side surfaces opposing each other in a width direction; a plurality of first and second internal electrodes stacked to have the dielectric layer interposed therebetween within the ceramic body and alternately exposed through the first and second end surfaces; and first and second external electrodes electrically connected to the first and second internal electrodes, respectively, and including first and second head parts formed on the first and second end surfaces, wherein a width of the first and second head parts is less than a width of the ceramic body, and when length, width and thickness of the ceramic body are defined as L, W, and T, respectively, $T/W>1.0$ is satisfied.

When the width of the ceramic body is defined as $W_B$ and the width of the first and second head parts is defined as $W_E$, $(W_B-W_E)/(2W_B)<0.45$ may be satisfied.

The first and second external electrodes may not be formed on the first and second side surfaces of the ceramic body.

The first and second external electrodes may further include first and second band parts embedded in the ceramic body such that one surfaces of the first and second band parts are exposed to the first or second main surface.

The length and width of the ceramic body may satisfy $L/W>1.0$.

The first and second internal electrodes maybe stacked in the thickness direction of the ceramic body.

The first and second internal electrodes maybe stacked in the width direction of the ceramic body.

The dielectric layers may have an average thickness of 0.1 μm to 0.6 μm.

The first and second internal electrodes may have an average thickness of 0.6 μm or less.

The dielectric layers may be stacked in an amount of 500 or more layers.

According to another aspect of the present invention, there is provided a board for mounting a multilayer ceramic electronic component, the board including: a printed circuit board having first and second electrode pads disposed thereon; and a multilayer ceramic electronic component installed on the printed circuit board, wherein the multilayer ceramic electronic component includes: a hexahedral ceramic body including dielectric layers and having first and second main surfaces opposing each other in a thickness direction, first and second end surfaces opposing each other in a length direction, and first and second side surfaces opposing each other in a width direction; a plurality of first and second internal electrodes stacked to have the dielectric layer interposed therebetween within the ceramic body and alternately exposed through the first and second end surfaces; and first and second external electrodes electrically connected to the first and second internal electrodes, respectively, and including first and second head parts formed on the first and second end surfaces, wherein a width of the first and second head parts is less than a width of the ceramic body, and when length, width and thickness of the ceramic body are defined as L, W, and T, respectively, $T/W>1.0$ is satisfied.

When the width of the ceramic body is defined as $W_B$ and the width of the first and second head parts is defined as $W_E$, $(W_B-W_E)/(2W_B)<0.45$ may be satisfied.

The first and second external electrodes may not be formed on the first and second side surfaces of the ceramic body.

The first and second external electrodes may further include first and second band parts embedded in the ceramic body such that one surfaces of the first and second band parts are exposed to the first or second main surface.

The length and width of the ceramic body may satisfy $L/W>1.0$.

The first and second internal electrodes may be stacked in the thickness direction of the ceramic body.

The first and second internal electrodes may be stacked in the width direction of the ceramic body.

The dielectric layers may have an average thickness of 0.1 µm to 0.6 µm.

The first and second internal electrodes may have an average thickness of 0.6 µm or less.

The dielectric layers may be stacked in an amount of 500 or more layers.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
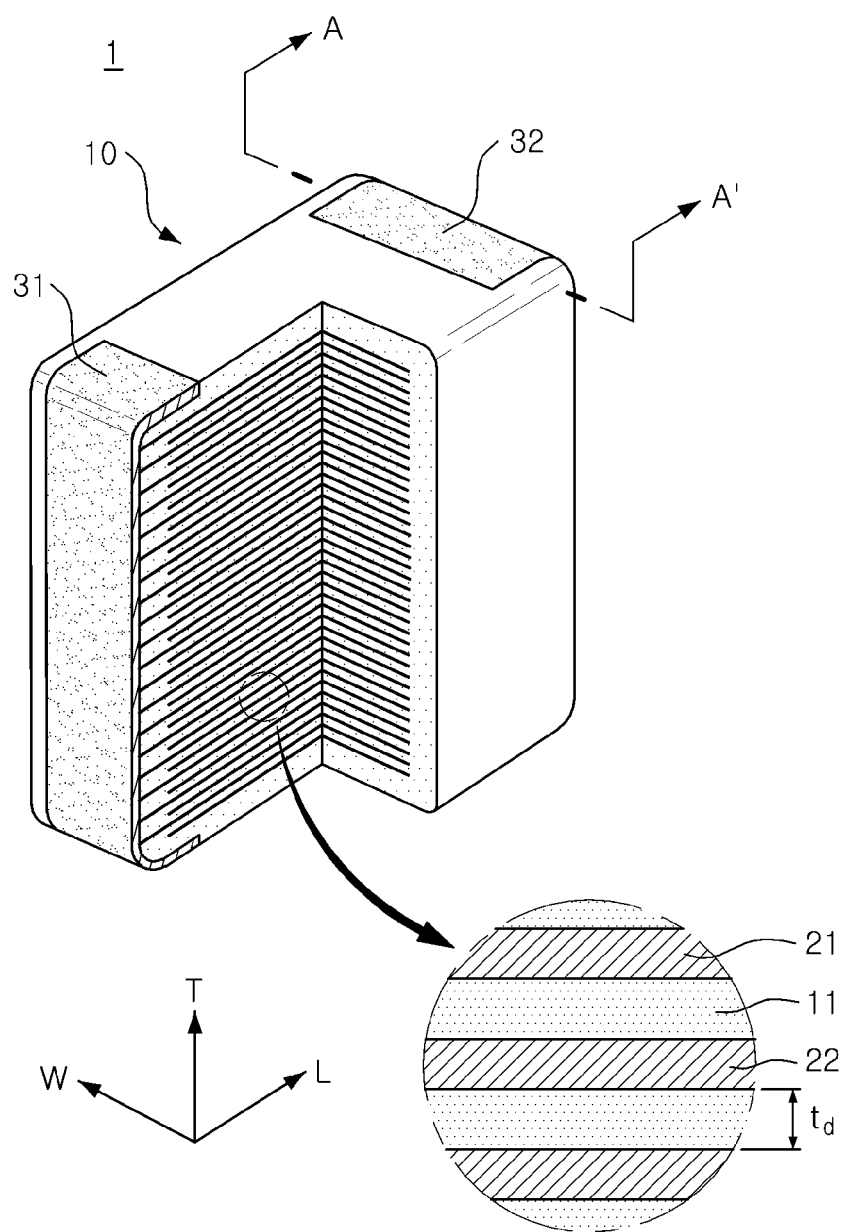
FIG. 1 is a partially cut-away perspective view schematically showing a multilayer ceramic electronic component according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Hereinafter, a multilayer ceramic electronic component according to an embodiment of the present invention will be described. Particularly, a multilayer ceramic capacitor will be described. However, the invention is not limited thereto.

Multilayer Ceramic Capacitor

Embodiments of the invention will now be described in detail with reference to the accompanying drawings.

FIG. 1 is a partially cut-away perspective view schematically showing a multilayer ceramic electronic component according to an embodiment of the present invention.

Figure 2:
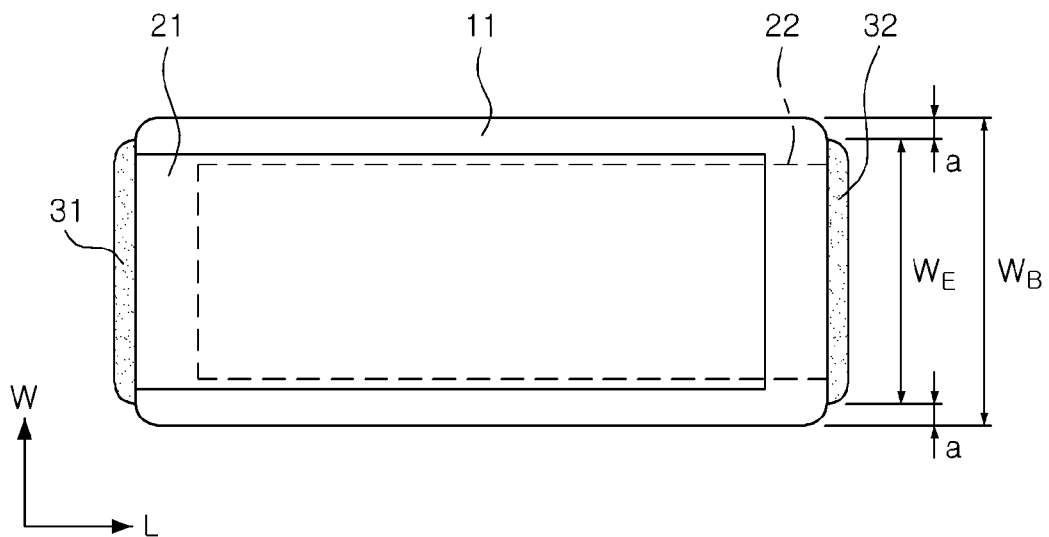
FIG. 2 is a cross-sectional view of the multilayer ceramic electronic component of FIG. 1 taken in a W(width)-L (length) direction.

FIG. 2 is a cross-sectional view of the multilayer ceramic electronic component of FIG. 1 taken in a W(width)-L (length) direction.

Referring to FIGS. 1 and 2, a multilayer ceramic electronic component 1 according to the present embodiment of the invention may include: a hexahedral ceramic body 10 including dielectric layers 11 and first and second main surfaces opposing each other in a thickness direction, first and second end surfaces opposing each other in a length direction, and first and second side surfaces opposing each other in a width direction; a plurality of first and second internal electrodes 21 and 22 formed in the ceramic body and alternately exposed through the first and second end surfaces, having the dielectric layer 11 interposed therebetween; and first and second external electrodes 31 and 32 electrically connected to the first and second internal electrodes, respectively, and including first and second head parts formed on the first and second end surfaces, wherein a width of the first and second head parts is less than a width of the ceramic body, and when the width of the ceramic body is defined as W and a thickness thereof is defined as T, T/W>1.0 is satisfied.

A shape of the ceramic body 10 is not particularly limited, and for example, the ceramic body 10 may have a hexahedral shape.

Meanwhile, in the multilayer ceramic capacitor according to the embodiment of the invention, a 'length direction' refers to an 'L' direction, a 'width direction' refers to a 'W' direction, and a 'thickness direction' refers to a 'T' direction. Here, the 'thickness direction' is the same as a direction in which dielectric layers are stacked, that is, a 'stacking direction'.

In the present embodiment of the invention, the ceramic body 10 may have the first and second side surfaces opposing each other in the width direction, the first and second end surfaces opposing each other in the length direction, and the first and second main surfaces opposing each other in the thickness direction.

The multilayer ceramic capacitor 1 according to the embodiment of the invention may include the ceramic body 10 including the dielectric layers 11 and the first and second internal electrodes 21 and 22 stacked to face each other in the ceramic body 10,l having the dielectric layer 11 interposed therebetween.

In addition, the ceramic body may have a substantially hexahedral shape, and when a width of the ceramic body is defined as W, and a thickness thereof is defined as T, T/W>1.0 may be satisfied.

A material for forming the first and second internal electrodes 21 and 22 is not particularly limited. For example, the first and second internal electrodes 21 and 22 may be formed of a conductive paste made of at least one of noble metal materials such as palladium (Pd) and a palladium-silver (Pd—Ag) alloy, and the like, nickel (Ni) and copper (Cu).

The dielectric layer 11 may include a ceramic powder having high permittivity, for example, a barium titanate-based ($BaTiO_3$) powder or a strontium titanate-based ($SrTiO_3$) powder, but the invention is not limited thereto.

Meanwhile, the first and second internal electrodes 21 and 22, a pair of electrodes having opposite polarities, may be formed on the dielectric layers 11 by printing a conductive paste containing a conductive metal at a predetermined thickness.

An average thickness of the first and second internal electrodes 21 and 22 after sintering is not particularly limited as long as the internal electrodes may form capacitance. For example, the average thickness of the first and second internal electrodes may be 0.6 µm or less.

The average thickness of the first and second internal electrodes 21 and 22 may be measured on an image obtained by scanning a cross-section of the ceramic body 10 in a width direction using a scanning electron microscope (SEM).

For example, the average thickness of the internal electrode may be calculated by measuring thicknesses at thirty equidistant points in the width direction of any one of the internal electrodes extracted from the image obtained by scanning the cross-section of the ceramic body 10 in the width and thickness (W-T) direction cut in a central portion of the ceramic body 10 in the length direction, using the SEM.

The thicknesses at thirty equidistant points may be measured in a capacitance forming part, a region in which the first and second internal electrodes 21 and 22 are overlapped with each other.

In addition, in the case in which the average thickness measurement is performed with respect to 10 or more internal electrodes, the average thickness of the internal electrodes may be significantly generalized.

Further, the first and second internal electrodes 21 and 22 may be alternately exposed through both end surfaces of the ceramic body, and may be electrically insulated from each other by the dielectric layer 11 disposed therebetween.

That is, the first and second internal electrodes 21 and 22 may be electrically connected to the first and second external electrodes 31 and 32, respectively, through portions of the first and second internal electrodes 21 and 22 alternately exposed through the end surfaces of the ceramic body 10.

Therefore, in the case in which voltage is applied to the first and second external electrodes 31 and 32, electric charges are stored between the first and second internal electrodes 21 and 22 facing each other. Here, capacitance of the multilayer ceramic capacitor 1 is in proportion to an area of an overlap region of the first and second internal electrodes 21 and 22.

In order to form the capacitance, the first and second external electrodes 31 and 32 may be formed on the outer surfaces of the ceramic body 10, and may be electrically connected to the first and second internal electrodes 21 and 22, respectively.

The first and second external electrodes 31 and 32 may be formed of the same conductive material as that of the internal electrodes, but the material for the first and second external electrodes 31 and 32 is not limited thereto. For example, the first and second external electrodes 31 and 32 may be formed of copper (Cu), silver (Ag), nickel (Ni), or the like.

The first and second external electrodes 31 and 32 may be formed by adding a glass frit to a metal powder to prepare a conductive paste, applying the prepared conductive paste to the outer surfaces of the ceramic body 10, followed by sintering thereof.

The ceramic body 10 may be formed by stacking the plurality of dielectric layers 11 and performing a sintering process. A shape and dimensions of the ceramic body and the number of stacked dielectric layers included therein are not limited to those shown in the present embodiment.

In addition, the plurality of dielectric layers 11 forming the ceramic body 10 may be in a sintered state, such that boundaries between adjacent dielectric layers may not be discernable without using the SEM.

According to the embodiment of the invention, an average thickness td of the dielectric layer 11 may be arbitrarily changed according to a capacity design of the multilayer ceramic capacitor 1, but the average thickness of the dielectric layer after sintering may be 0.1 to 0.6 μm.

The average thickness td of the dielectric layer 11 may be measured on the image obtained by scanning the cross-section of the ceramic body 10 in the width direction using the SEM.

For example, the average thickness may be calculated by measuring thicknesses at thirty equidistant points in the width direction of any one of the dielectric layers extracted from the image obtained by scanning the cross-section of the ceramic body 10 in the width and thickness (W-T) direction, cut in the central portion of the ceramic body 10 in the length direction, using the SEM.

The thicknesses at thirty equidistant points may be measured in a capacitance forming part, in which the first and second internal electrodes 21 and 22 are overlapped with each other.

In addition, in the case in which the average thickness measurement is performed with respect to 10 or more dielectric layers, the average thickness of the dielectric layers may be significantly generalized.

The number of stacked dielectric layers 11 is not particularly limited, but for example, may be 500 or more.

By allowing the number of stacked dielectric layers 11 to be 500 or more, a high capacitance multilayer ceramic capacitor, in which the thickness T of the ceramic body is greater than the width W thereof, may be realized.

Meanwhile, $T/W>1.0$ may be satisfied when the width and the thickness of the ceramic body 10 are defined as W and T, respectively.

The multilayer ceramic capacitor 1 according to the embodiment of the invention is formed to have an increased number of stacked layers therein for the realization of high capacitance, and the thickness T of the ceramic body 10 may be greater than the width W thereof.

General multilayer ceramic capacitors, on the other hand, have been manufactured such that a width thereof is almost the same as a thickness thereof.

However, a size of the multilayer ceramic capacitor according to the embodiment of the invention may be decreased, and sufficient space maybe secured when being mounted on a board, and therefore, the number of stacked layers may be increased in order to realize a high capacitance multilayer ceramic capacitor.

Since the stacking direction of the dielectric layers in the ceramic body is a thickness direction, as the number of stacked layers is increased, a relationship of thickness T and width W of the ceramic body may satisfy $T/W>1.0$.

Meanwhile, since the multilayer ceramic capacitor is manufactured to have the relationship between the thickness T and the width W of the ceramic body satisfying $T/W>1.0$, it may topple over when being mounted on a board, causing a short-circuit to degrade reliability.

In particular, the relationship between the length L and the width W of the ceramic body may satisfy the following equation: $L/W>1.0$.

In the case in which the ceramic body is manufactured to satisfy $T/W>1.0$ and $L/W>1.0$ as described in the present embodiment of the invention, when the multilayer ceramic capacitor is mounted on the board, cases in which the multilayer ceramic capacitors topple over in the width direction may be more than cases in which the multilayer ceramic capacitors topple over in the length direction.

Therefore, according to the embodiment of the invention, the above-described problem may be solved by controlling the shapes of the external electrodes.

As shown in FIG. 2, the cross-sectional view of the multilayer ceramic electronic component of FIG. 1 in the W(width)-L(length) direction, portions of the first and second external electrodes 31 and 32 formed on the end surfaces of the ceramic body may have a width $W_E$ less than a width $W_B$ of the ceramic body.

In other words, when the portions of the first and second external electrodes 31 and 32 formed on the end surfaces of the ceramic body are defined as first and second head parts, the width $W_E$ of the first and second head parts may be less than the width $W_B$ of the ceramic body. In addition, the width of the first and second external electrodes may be less than the width of the ceramic body and the first and second external electrodes may not be formed on the side surfaces of the ceramic body.

That is, when the width of the ceramic body is defined as $W_B$, the width of the first and second head parts is defined $W_E$, and $(W_B-W_E)/2$ is defined as a, the multilayer ceramic capacitor may be manufactured to satisfy $0<a/W_B$.

In addition, $(W_B-W_E)/(2W_B)$ may satisfy $(W_B-W_E)/(2W_B)<0.45$. In other words, $0<a/W_B<0.45$ may be satisfied.

In the case in which $a/W_B$ is greater than 0, the width of the first and second head parts is less than the width of the ceramic body and the external electrodes are not formed on the first and second side surfaces opposing each other in the width direction of the ceramic body, and thus, even when the multilayer ceramic capacitor topples over at the time of being mounted on the board, a short-circuit generated due to contact between the external electrodes may be prevented.

In addition, in the case in which $a/W_B$ is greater than 0.45, the width of the external electrodes is extremely small, and thus, when the multilayer ceramic capacitor is mounted on the board, a defective contact between the multilayer ceramic capacitor and the board may occur.

Figure 3:
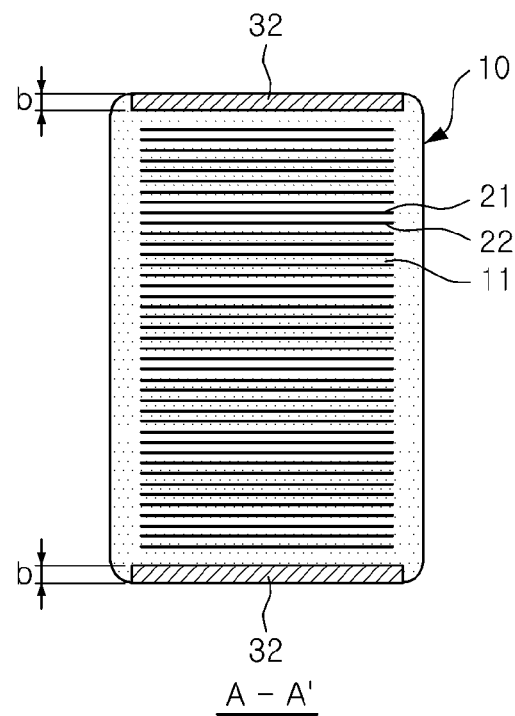
FIG. 3 is a cross-sectional view of the multilayer ceramic electronic component of FIG. 1 taken along line A-A'.

FIG. 3 is a cross-sectional view of the multilayer ceramic electronic component of FIG. 1 taken along line A-A'.

As shown in FIG. 3, when portions of the first and second external electrodes 31 and 32 extending from the first and second head parts to the first and second main surfaces of the ceramic body are defined as first and second band parts, respectively, the first and second band parts may be embedded in the ceramic body 10 such that one surfaces of the first and second band parts are exposed to the first or second main surface of the ceramic body 10.

That is, the first and second band parts of the first and second external electrodes formed in the first and second main surfaces of the ceramic body may not be formed on the surfaces of the ceramic body, but may be embedded in the ceramic body so as not to protrude from the surfaces of the ceramic body, whereby a phenomenon in which the multilayer ceramic capacitor topples over when being mounted on the board may be decreased.

Meanwhile, in order to facilitate the electrical connection to the outside at the time of being mounted on the board, the first and second band parts may not be completely embedded in the ceramic body, but may be embedded therein with one surfaces thereof being exposed, and the exposed one surfaces of the first and second band parts may be on a level with the first and second main surfaces of the ceramic body.

That is, when a thickness of the first and second external electrodes formed on the first and second main surfaces of the ceramic body is defined as b, a depth of the first and second external electrodes embedded in the first and second main surfaces is b.

That is, according to the embodiment of the invention, the first and second external electrodes may include the first and second head parts formed on the first and second end surfaces opposing each other and the first and second band parts extending from the first and second head parts to the first and second main surface, and the external electrodes may not be formed on the first and second side surfaces.

In addition, the first and second head parts may have the width less than that of the ceramic body and satisfy $(W_B-W_E)/(2W_B)<0.45$, and the first and second band parts may be embedded in the ceramic body so as to be on a level with the first and second main surfaces of the ceramic body.

Since the external electrodes are not formed on the side surfaces of the ceramic body, even when the multilayer ceramic capacitor topples over at the time of being mounted on the board, theshort-circuit may not occur, reliability thereof may be improved. In addition, an interval between the multilayer ceramic capacitors mounted on the board may be reduced as compared with the related art, whereby a mounting density may be improved.

In addition, in the case in which the width of the external electrodes is less than the width of the ceramic body, the phenomenon in which the multilayer ceramic capacitor topples over may be generated. However, the external electrodes may be embedded in the first and second main surfaces of the ceramic body, whereby the phenomenon in which the multilayer ceramic capacitor topples over may be significantly reduced.

Figure 4:
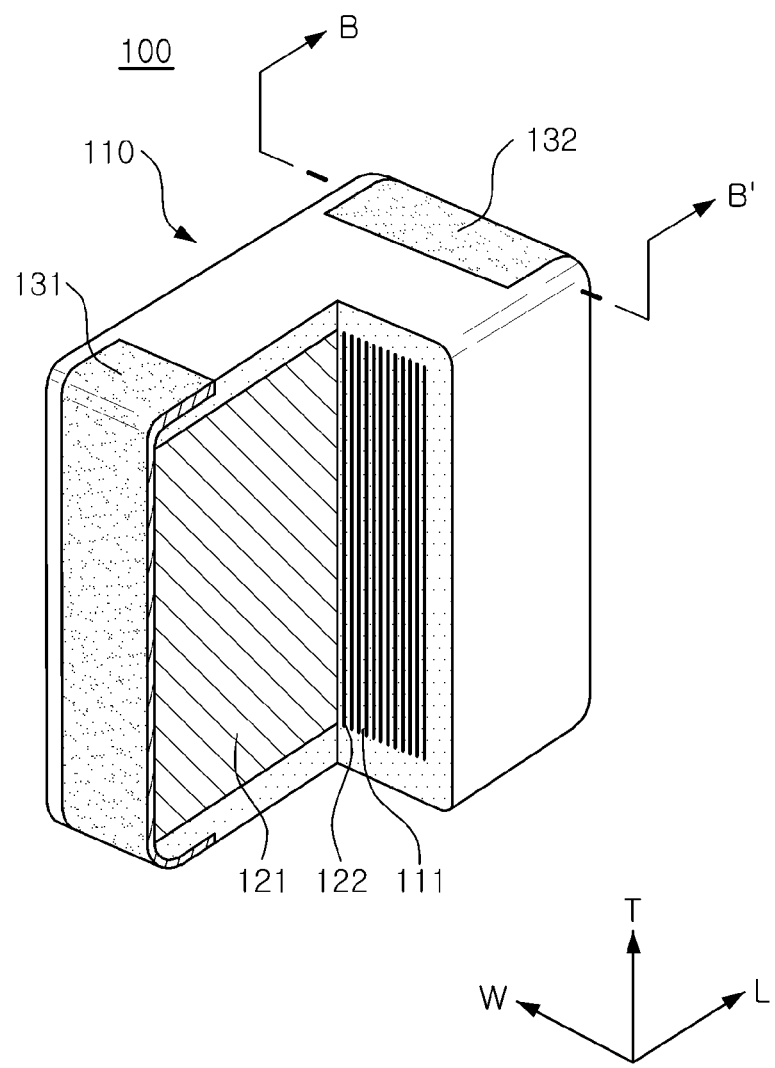
FIG. 4 is a partially cut-away perspective view schematically showing a multilayer ceramic electronic component according to another embodiment of the present invention.

FIG. 4 is a partially cut-away perspective view schematically showing a multilayer ceramic capacitor according to another embodiment of the invention.

Figure 5:
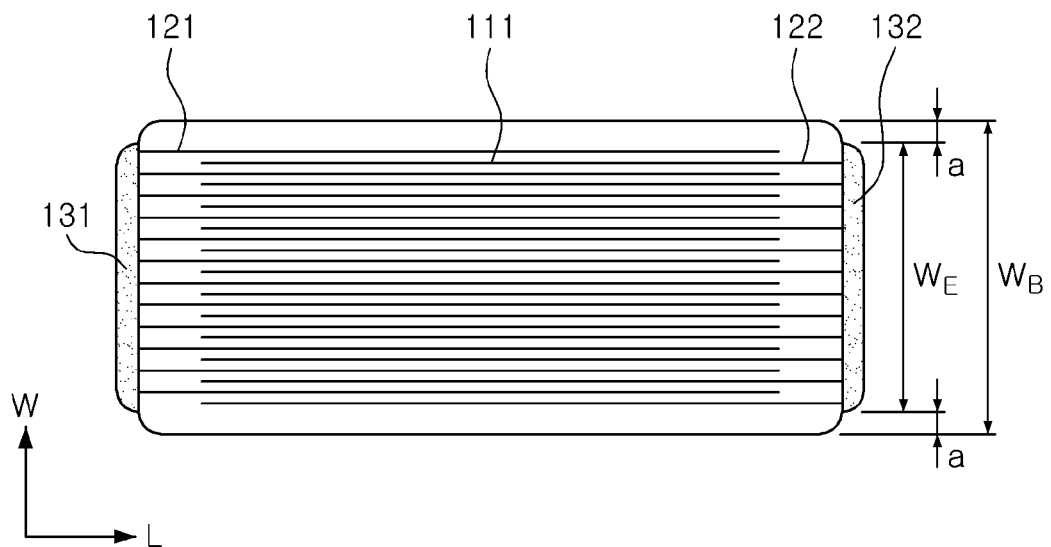
FIG. 5 is a cross-sectional view of the multilayer ceramic electronic component of FIG. 4 taken in a W(width)-L (length) direction.
Figure 6:
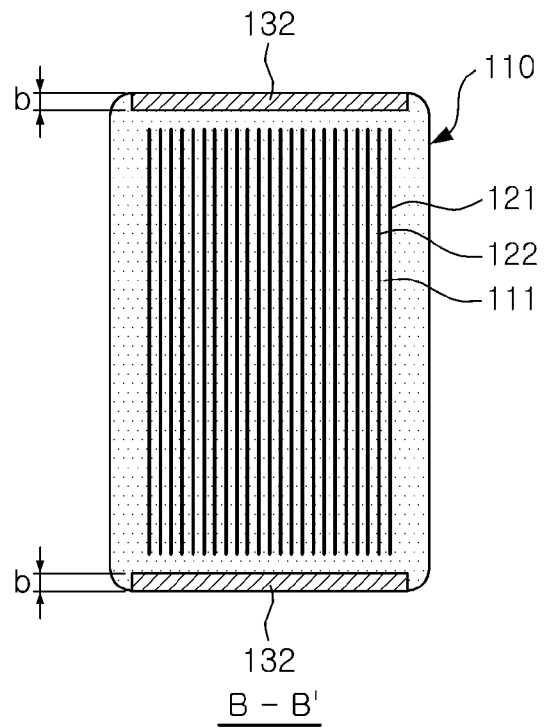
FIG. 6 is a cross-sectional view of the multilayer ceramic electronic component of FIG. 4 taken along line B-B'.

FIG. 5 is a cross-sectional view of the multilayer ceramic capacitor of FIG. 4 taken in a W(width)-L(length) direction, and FIG. 6 is a cross-sectional view of the multilayer ceramic electronic component of FIG. 4 taken along line B-B'.

Referring to FIGS. 4 to 6, in the multilayer ceramic capacitor 100 according to this embodiment of the invention, a 'length direction' refers to an 'L' direction, a 'width direction' refers to a 'W' direction, and a 'thickness direction' refers to a 'T' direction. Here, the 'width direction' is the same as a direction in which dielectric layers are stacked, that is, a 'stacking direction'.

That is, as shown in FIGS. 4 to 6, unlike the multilayer ceramic capacitor according to the above-described embodiment of the invention, the multilayer ceramic capacitor 100 according to this embodiment of the invention has a ceramic body 110 in which a plurality of dielectric layers 111 are stacked in a width direction.

In the case in which the multilayer ceramic capacitor 100 according to another embodiment of the present invention is mounted on the board, the multilayer ceramic capacitor 100 according to another embodiment of the present invention may be vertically mounted on the board while internal electrodes thereof are perpendicular to the board.

Since other characteristics of the multilayer ceramic capacitor according to this embodiment of the invention are the same as those of the multilayer ceramic capacitor according to the above-described embodiment of the invention, a description thereof will be omitted.

Board for Mounting Multilayer Ceramic Capacitor

Figure 7:
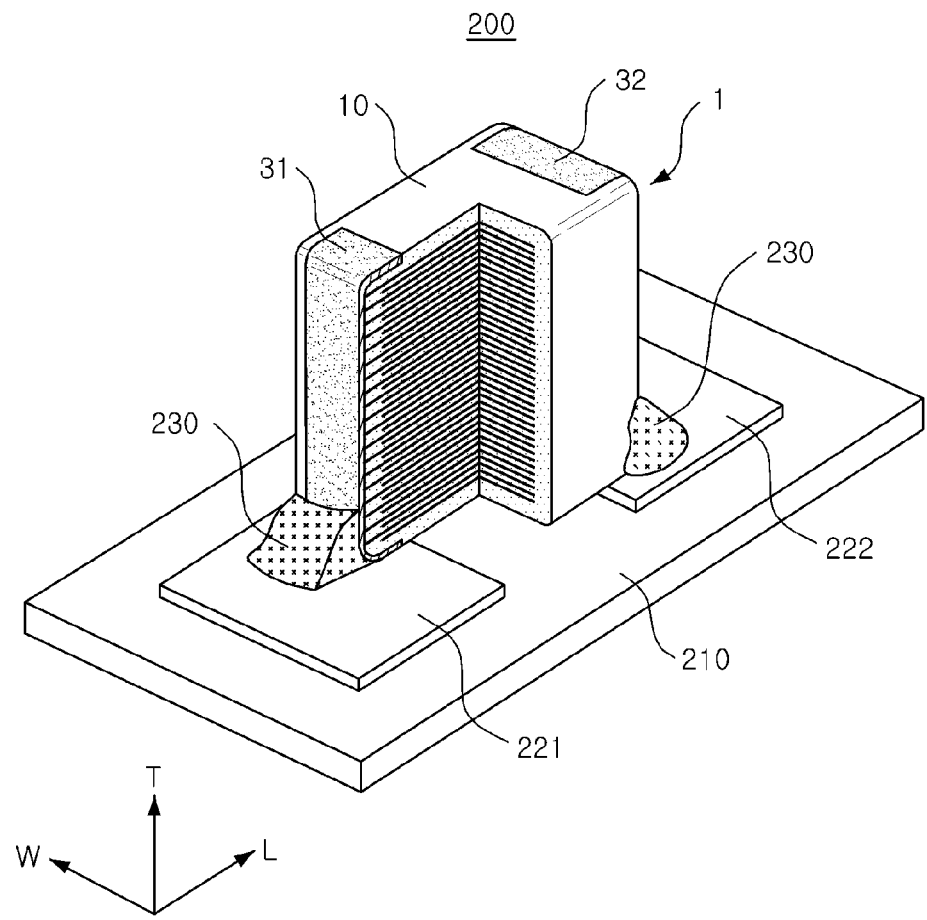
FIG. 7 is a perspective view schematically showing a board for mounting the multilayer ceramic electronic component of FIG. 1.
Figure 8:
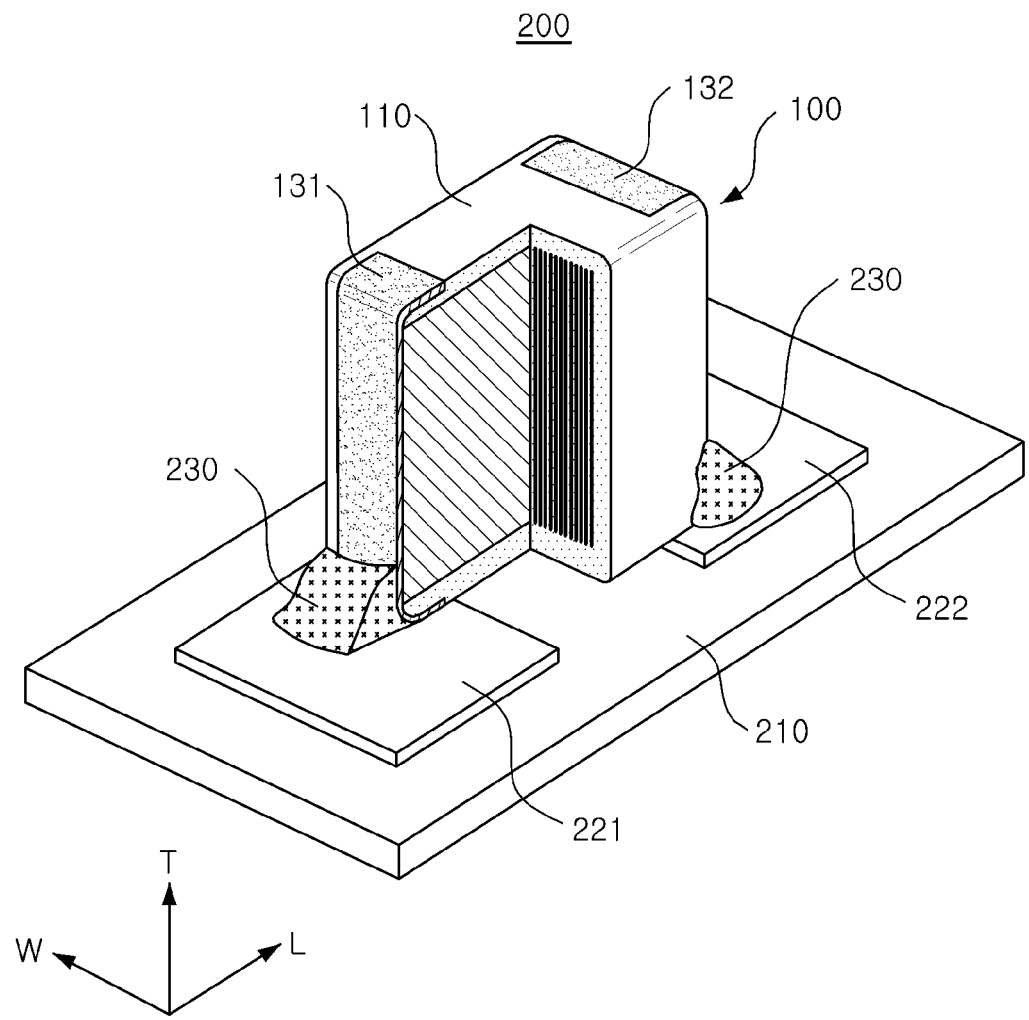
FIG. 8 is a perspective view schematically showing a board for mounting the multilayer ceramic electronic component of FIG. 4.

FIG. 7 is a perspective view schematically showing a board for mounting the multilayer ceramic electronic component of FIG. 1, and FIG. 8 is a perspective view schematically showing a board for mounting the multilayer ceramic electronic component of FIG. 4.

Referring to FIG. 7, a board 200 for mounting the multilayer ceramic capacitor 1 according to the embodiment of the invention may include a printed circuit board 210 on which the multilayer ceramic capacitor 1 is mounted horizontally, and first and second electrode pads 221 and 222 formed on the printed circuit board 210 so as to be spaced apart from each other.

Here, the multilayer ceramic capacitor 1 may be electrically connected to the printed circuit board 210 by a solder 230 in a state in which the first and second external electrodes 31 and 32 are positioned to contact the first and second electrode pads 221 and 222, respectively.

In addition, referring to FIG. 8, a board 200 for mounting the multilayer ceramic capacitor 100 according to another embodiment of the invention may include a printed circuit board 210 on which the multilayer ceramic capacitor 100 is mounted vertically, and first and second electrode pads 221 and 222 formed on the printed circuit board 210 so as to be spaced apart from each other.

As described above, in the boards for mounting the multilayer ceramic electronic components according to the embodiments of the invention, even when the multilayer ceramic capacitors are adjacently mounted on the board, the external electrodes are not formed on the side surfaces of the ceramic bodies, and thus short-circuits may not occur even when the multilayer ceramic capacitors topple over. In addition, the external electrodes are embedded in the first and second main surfaces of the ceramic bodies, whereby the toppling over of the multilayer ceramic capacitors may decrease.

Therefore, the multilayer ceramic capacitors having large capacitance and excellent reliability may be implemented and a mounting density thereof may be improved.

EXPERIMENTAL EXAMPLE

Experimental Examples of the invention were performed with respect to multilayer ceramic capacitors including dielectric layers having an average thickness of 0.6 μm or less, in order to test contact between the multilayer ceramic capacitors and a board and the occurrence of short-circuits in the case in which the multilayer ceramic capacitors topple over, in accordance with $(W_B-W_E)/(2W_B)$, when a width of a ceramic body is defined as $W_B$, and a width of first and second external electrodes is defined as $W_E$.

The multilayer ceramic capacitors according to the examples of the invention were manufactured as follows.

First, slurry containing a powder such as a barium titanate ($BaTiO_3$) powder having an average particle size of 0.1 μm was applied to a carrier film and dried, such that a plurality of ceramic green sheets having thicknesses of 1.05 μm. and 0.95 μm, respectively, were prepared to form the dielectric layers.

Then, a conductive paste for internal electrodes containing 40 to 50 parts by weight of a nickel powder having an average particle size of 0.1 μm to 0.2 μm was prepared.

After the conductive paste for internal electrodes was applied to the green sheets by a screen printing method to thereby form the internal electrodes, and 500 or more sheets were then stacked to form a multilayer body. A plurality of multilayer bodies was prepared by varying values of (b1+b2)/(a1+a2).

Then, the multilayer body was compressed and cut to thereby form chips having a 0603 (length x width) standard size, each having a ratio between thickness and width exceeding 1.0 (T/W>1.0), and the chips were sintered under a reducing atmosphere of $H_2$ 0.1% or less at a temperature ranging from 1,050° C. to 1,200° C.

Edges and corners of the chips were grinded by a grinder before the sintering process.

Next, processes such as an external electrode formation process, a plating layer formation process, and the like, were performed to manufacture the multilayer ceramic capacitor.

The following Table 1 shows results obtained by performing a short-circuit test and a contact test in accordance with $(W_B-W_E)/(2W_B)$. The short-circuit test was performed by determining whether or not a short-circuit occurred between adjacent multilayer ceramic capacitors in the case of the toppling over thereof. In the case in which the short-circuit occurred, it was represented by 'NG,' and in the case in which the short-circuit did not occur, it was represented by 'OK.'

In addition, after the multilayer ceramic capacitors were mounted on the board, a case in which 20 or greater out of 1000 contact defects occurred between the external electrodes and the board were generated was represented by 'NG,' and a case in which 20 or less out of 1000 contact defects occurred therebetween was represented by 'OK.'

TABLE 1

| Sample | $(W_B-W_E)/(2W_B)$ | Short-Circuit Test | Contact Test |
|---|---|---|---|
| 1* | 0 | NG | OK |
| 2 | 0.05 | OK | OK |
| 3 | 0.2 | OK | OK |
| 4 | 0.4 | OK | OK |
| 5 | 0.43 | OK | OK |
| 6* | 0.45 | OK | NG |

*Comparative Example

With reference to Table 1, it may be appreciated that in the case in which the multilayer ceramic capacitors toppled over, the short-circuit between the adjacent multilayer ceramic capacitors occurred in Sample 1 (Comparative Example), and the contact between the multilayer ceramic capacitors and the board was not implemented in Sample 6 (Comparative Example).

Therefore, it may be appreciated that when the multilayer ceramic capacitors were manufactured to satisfy $0<(W_B-W_E)/(2W_B)<0.45$, satisfactory results were achieved.

As set forth above, according to embodiments of the invention, a multilayer ceramic electronic component can have improvements in a reduction of defects such as the toppling over thereof when being mounted on a board and short-circuits, while implementing high capacitance, and the board for mounting the same may be provided.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic component comprising:
   a hexahedral ceramic body including dielectric layers and having first and second main surfaces opposing each other in a thickness direction, first and second end surfaces opposing each other in a length direction, and first and second side surfaces opposing each other in a width direction;
   a plurality of first and second internal electrodes stacked to have the dielectric layer interposed therebetween within the ceramic body and alternately exposed through the first and second end surfaces; and
   first and second external electrodes electrically connected to the first and second internal electrodes, respectively, and including first and second head parts formed on the first and second end surfaces,
   wherein a width of the first and second head parts is less than a width of the ceramic body, and
   when length, width and thickness of the ceramic body are defined as L, W, and T, respectively, T/W>1.0 is satisfied.

2. The multilayer ceramic electronic component of claim 1, wherein when the width of the ceramic body is defined as $W_B$ and the width of the first and second head parts is defined as $W_E$, $(W_B-W_E)/(2W_B)<0.45$ is satisfied.

3. The multilayer ceramic electronic component of claim 1, wherein the first and second external electrodes are not formed on the first and second side surfaces of the ceramic body.

4. The multilayer ceramic electronic component of claim 1, wherein the first and second external electrodes further include first and second band parts embedded in the ceramic body such that one surfaces of the first and second band parts are exposed to the first or second main surface.

5. The multilayer ceramic electronic component of claim 1, wherein the length and width of the ceramic body satisfy L/W>1.0.

6. The multilayer ceramic electronic component of claim 1, wherein the first and second internal electrodes are stacked in the thickness direction of the ceramic body.

7. The multilayer ceramic electronic component of claim 1, wherein the first and second internal electrodes are stacked in the width direction of the ceramic body.

8. The multilayer ceramic electronic component of claim 1, wherein the dielectric layers have an average thickness of 0.1 μm to 0.6 μm.

9. The multilayer ceramic electronic component of claim 1, wherein the first and second internal electrodes have an average thickness of 0.6 μm or less.

10. The multilayer ceramic electronic component of claim 1, wherein the dielectric layers are stacked in an amount of 500 or more layers.

11. A board for mounting a multilayer ceramic electronic component, the board comprising:
a printed circuit board having first and second electrode pads disposed thereon; and
a multilayer ceramic electronic component installed on the printed circuit board,
wherein the multilayer ceramic electronic component includes:
a hexahedral ceramic body including dielectric layers and having first and second main surfaces opposing each other in a thickness direction, first and second end surfaces opposing each other in a length direction, and first and second side surfaces opposing each other in a width direction;
a plurality of first and second internal electrodes stacked to have the dielectric layer interposed therebetween within the ceramic body and alternately exposed through the first and second end surfaces; and
first and second external electrodes electrically connected to the first and second internal electrodes, respectively, and including first and second head parts formed on the first and second end surfaces,
a width of the first and second head parts is less than a width of the ceramic body, and
when length, width and thickness of the ceramic body are defined as L, W, and T, respectively, T/W>1.0 is satisfied.

12. The board of claim 11, wherein when the width of the ceramic body is defined as $W_B$ and the width of the first and second head parts is defined as $W_E$, $(W_B-W_E)/(2W_B)<0.45$ is satisfied.

13. The board of claim 11, wherein the first and second external electrodes are not formed on the first and second side surfaces of the ceramic body.

14. The board of claim 11, wherein the first and second external electrodes further include first and second band parts embedded in the ceramic body such that one surfaces of the first and second band parts are exposed to the first or second main surface.

15. The board of claim 11, wherein the length and width of the ceramic body satisfy L/W>1.0.

16. The board of claim 11, wherein the first and second internal electrodes are stacked in the thickness direction of the ceramic body.

17. The board of claim 11, wherein the first and second internal electrodes are stacked in the width direction of the ceramic body.

18. The board of claim 11, wherein the dielectric layers have an average thickness of 0.1 μm to 0.6 μm.

19. The board of claim 11, wherein the first and second internal electrodes have an average thickness of 0.6 μm or less.

20. The board of claim 11, wherein the dielectric layers are stacked in an amount of 500 or more layers.

* * * * *